US012633360B2

(12) United States Patent
Eliash et al.

(10) Patent No.: US 12,633,360 B2
(45) Date of Patent: May 19, 2026

(54) MANAGING ASYNCHRONOUS POWER LOSS IN A MEMORY DEVICE

(71) Applicant: MICRON TECHNOLOGY, INC., Boise, ID (US)

(72) Inventors: Tomer Tzvi Eliash, Sunnyvale, CA (US); Yu-Chung Lien, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 18/524,721

(22) Filed: Nov. 30, 2023

(65) Prior Publication Data

US 2024/0194279 A1    Jun. 13, 2024

Related U.S. Application Data

(60) Provisional application No. 63/431,900, filed on Dec. 12, 2022.

(51) Int. Cl.
| | |
|---|---|
| *G11C 16/06* | (2006.01) |
| *G11C 16/10* | (2006.01) |
| *G11C 16/32* | (2006.01) |
| *G11C 16/34* | (2006.01) |

(52) U.S. Cl.
CPC ........ *G11C 16/3459* (2013.01); *G11C 16/102* (2013.01); *G11C 16/32* (2013.01)

(58) Field of Classification Search
CPC ... G11C 16/3459; G11C 16/102; G11C 16/32; G11C 16/0483; G11C 16/10; G11C 16/30
USPC ...................................................... 365/185.22
See application file for complete search history.

(56) References Cited

U.S. PATENT DOCUMENTS

| | | | | |
|---|---|---|---|---|
| 9,372,694 | B2 * | 6/2016 | Yoneda ............... | G06F 11/1461 |
| 9,672,919 | B2 * | 6/2017 | Meir ...................... | G11C 16/10 |
| 12,254,926 | B2 * | 3/2025 | Lien ................... | G11C 16/3459 |
| 2013/0166864 | A1 * | 6/2013 | Yerushalmi ........... | G06F 3/0634 |
| | | | | 711/E12.103 |

* cited by examiner

*Primary Examiner* — Tha-O H Bui
(74) *Attorney, Agent, or Firm* — Lowenstein Sandler LLP

(57) ABSTRACT

A system can include a plurality of memory devices including a volatile memory device and a non-volatile memory device and a processing device operatively coupled with the plurality of memory devices, to perform operations including: determining whether a parameter of a power supply of the volatile memory device satisfies a threshold criterion; responsive to determining that the parameter of the power supply satisfies the threshold criterion, modifying a value of a parameter of a program operation; and programming, using the modified value of the parameter, designated data stored on the volatile memory device to a designated location on the non-volatile memory device.

20 Claims, 6 Drawing Sheets

400

Determine whether a parameter of a power supply of a
volatile memory device satisfies a threshold criterion
410

Responsive to determining that the parameter of the power
supply satisfies the threshold criterion, stop performance of
operations in the volatile memory device
420

Switch a program mode being used for programming in the
memory device to a fast program mode
430

Program, using the fast program mode, critical data
associated with the volatile memory device to a designated
block on a non-volatile memory device
440

MANAGING ASYNCHRONOUS POWER LOSS IN A MEMORY DEVICE

RELATED APPLICATIONS

This application claims the benefit of U.S. Provisional Patent Application No. 63/431,900, filed Dec. 12, 2022, the entire contents of which are incorporated by reference herein.

TECHNICAL FIELD

Embodiments of the disclosure relate generally to memory sub-systems, and more specifically, relate to managing asynchronous power loss (APL) in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 4-5 are flow diagrams of example methods for managing APL in accordance with some embodiments of the present disclosure.

DETAILED DESCRIPTION

Figure 1:
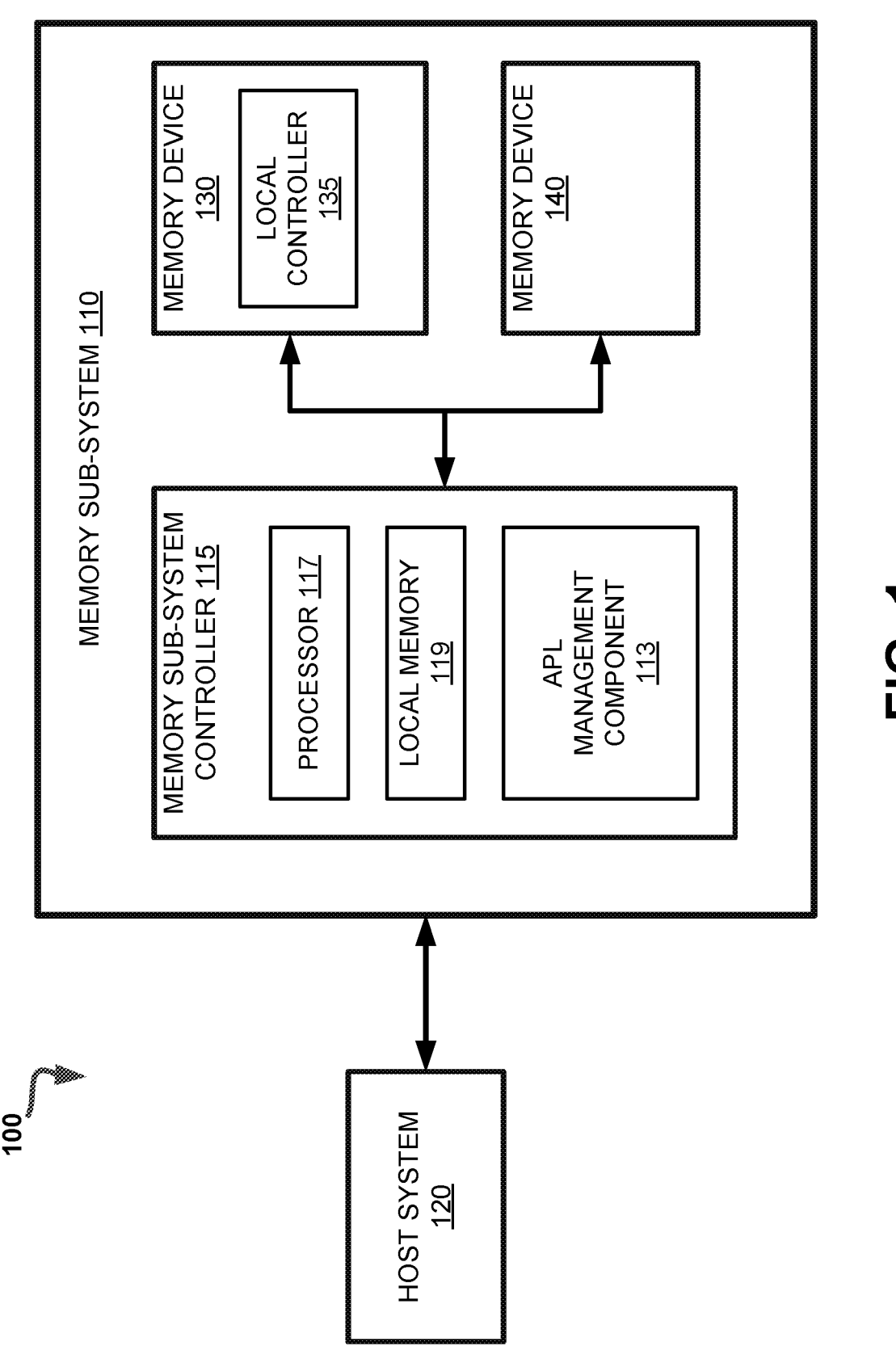
FIG. 1 illustrates an example computing system that includes a memory sub-system in accordance with some embodiments of the present disclosure.

Aspects of the present disclosure are directed to managing asynchronous power loss (APL) in memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include one or more planes. For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include a two-dimensional grid of memory cells, which are formed onto a silicon wafer in an array of columns and rows. A block hereinafter refers to a unit of the memory device used to store data and can include a group of memory cells that are electrically coupled to one or more conductive lines referred to as access lines or "wordlines." One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

In systems that utilize memory devices, there can be a delay between the time that data is sent to be stored and the time that the data actually gets recorded on the medium of the memory device. Similarly, there can be a delay between the time that data is requested to be retrieved from the memory device and the time it is actually received by the requesting component. This often occurs due to the data having to pass through other components of the system before arriving at its destination and due to the latency of the read and write operations being executed on the medium of the memory device. As a result of this delay, it is possible that a system or a memory device in a system may experience a power loss event, such as an asynchronous power loss (APL), while there is still data that has been either requested or transmitted through components of the system or pending in a component to be written or retrieved when the power loss occurs. Some approaches simply deemed this so-called "in flight" data to be lost, in many cases, irretrievably. However, memory devices that include non-volatile media allow for the possibility of in-flight data being saved before power is completely lost in a computing system.

At an event of power loss, the memory device can perform an emergency system operation, in which a component of a system detects a sudden drop of the power supply voltage and sends a notification across the system before the power supply is completely compromised due to the APL event. In such case, some systems with non-volatile media devices can include capacitors that can provide power to the components of the system when the primary source of power is lost. However, capacitor size and energy storage capacity are very limited in many cases. Moreover, the power provided by a capacitor can often be needed to be distributed and shared among many components to provide power for their operation when such a power loss event occurs. Because the capacitors often have very limited power-sustaining time, some components of the system and some of their respective operations may need to be prioritized during a power loss event to use the available power-sustaining efficiently.

Notably, if a power loss event occurs while there is data in-flight and it is not saved in a non-volatile medium or securely retrieved by another component before complete power loss, it can be lost. Saving such data may require a sufficient power-sustaining time to permit the systems to complete the pending operations. In addition, system data or metadata that will be used when the system is powered up may be lost because there are no special operations for such data, and the loss of such data can lead to a loss of integrity for already recorded data, data corruption, increased latency, and performance degradation in various types of non-volatile memory devices. For example, as part of the boot operation, the system may need to determine which blocks were open and what was the last page that was written into at the time of power loss. Such determination usually takes long time due to the requirement to search the last written pages and/or blocks and the requirement to determine the reliability of the last written data (e.g., whether the data is compromised in the case that the power loss happened during the write operation). As another example, the system, upon power up, may need to determine the duration of the power loss because power down exceeding a certain time threshold may require refresh of certain areas of the memory device. Without such determination may risk the data integrity.

Aspects of the present disclosure address the above and other deficiencies by using a memory sub-system that can in response to detecting a potential power loss event, stop performance of pending operations and save designated data to a non-volatile memory device by using a fast program mode. By altering the priority of operations and changing the programming speed in the memory sub-system, the memory sub-system controller can prioritize designated data to be saved before a complete loss of power occurs. The designated data refers to system data and metadata that are required for system recovery upon power up and may also include system data and metadata that would otherwise decrease system recovery time by at least a predefined threshold value. In some implementations, the designated data may include open block data, last-used wordline data, last-used sub-block data, location data of a media scan, time data, and/or read disturb data. The designated data may reflect data that has been retrieved by the system and stored in the system (e.g., in a data structure in a volatile storage) most recently prior to the power loss event. The open block data may include identifiers (e.g., physical address or logical address) of the blocks that were open at the time of the power loss event. The last-used wordline or sub-block data may include the identification (e.g., physical address or logical address) of the wordline or sub-block that was most recently used. The location data of a media scan may include the identification of a location in a media most recently scanned. The time data may include the time and date information when data is retrieved and stored. The read disturb data refers to data of error (e.g., count) where a read to one wordline impacts the threshold voltages of unread cells in different wordlines of the same block.

Specifically, the memory sub-system controller can detect an occurrence of a potential power loss event by determining that a value of a certain parameter of a power supply (including voltage, current, etc.) satisfies a predefined threshold criterion, e.g., a voltage at an interface or the input/output pin is lower than a certain value, or a change of a voltage at an interface or the input/output pin exceeds a certain value. The memory sub-system controller can implement a hardware detector to detect a value or a change of a value of the parameter, for example, voltages passing through an interface or the input/output pin and other components of the memory sub-system. In one example, when the hardware detector detects a drop in the voltage exceeding a predetermined threshold value, the memory sub-system controller can determine that a power loss is imminent.

When an imminent power loss condition is detected, the memory sub-system controller can stop performance of operations, including transmission of data between components of the memory sub-system (e.g., all data from/to the volatile memory of the memory sub-system). The operations can include writing, reading, erasing operations, etc. Stopping the transmission of data can involve disabling the communication channels between components that are identified by the settings of the memory sub-system controller. In some implementations, the memory sub-system controller can send to other components of the memory sub-system a stop command. In some embodiments, stopping the operation performance and data transmission may involve marking, as uncompleted or invalid, the pending operations and the operations currently being performed but unfinished, and saving it as part of the designated data. In some embodiments, stopping the operation performance and data transmission may involve clearing one or more queues which hold pending operations.

The memory sub-system controller can make a change of program mode for programing (i.e., writing) designated data to a non-volatile memory device of memory sub-system simultaneously (or during time periods at least partially overlapping) while stopping the operation performance and data transmission. The memory sub-system controller can switch from the current program mode to the fast program mode. For example, the memory sub-system controller may switch from the current program mode to the fast program mode responsive to determining that the parameter of the power supply satisfies the threshold criterion.

Switching from the current program mode to the fast program mode may involve modifying a value of a voltage parameter applied during a program operation. The parameter may specify a total time for applying a voltage pulse in the program operation, specify a voltage applied in the program operation, specify a duration of a program verify phase in the program operation, or a combination thereof. Other methods that would decrease the program time would also be applicable to the present disclosure.

In some implementations, the memory sub-system controller can retrieve the designated data responsive to detecting a potential power loss event. In some implementations, the memory sub-system controller can retrieve and store the designated data at a predetermined time prior to the detection or stopping action, for example, when the memory sub-system controller retrieves and stores the designated data at a predetermined frequency during a normal operation. In some implementations, the processing device receives the designated data at a predetermined frequency and stores the designated data in a volatile memory device.

Advantages of the present disclosure include but are not limited to efficiently saving designated data in an imminent potential power loss condition, by using a fast programming method to reduce the time needed to have power sustained (e.g., by a capacitor) during a power loss event. The saved designated data facilitates an efficient restoration of the system (e.g., shorter recovery time) upon a power up following an APL.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels to form management units (MUs).

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processors.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory sub-system 110 includes an APL management component 113. In some embodiments, the memory sub-system controller 115 includes at least a portion of the APL management component 113. In some embodiments, the APL management component 113 is part of the host system 110, an application, or an operating system. In other embodiments, local media controller 135 includes at least a portion of APL management component 113 and is configured to perform the functionality described herein. Further details regarding the operations of the APL management component 113 are described below with reference to FIGS. 2-6.

It will be appreciated by those skilled in the art that additional circuitry and signals can be provided, and that the components of FIG. 1 have been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Figure 2:
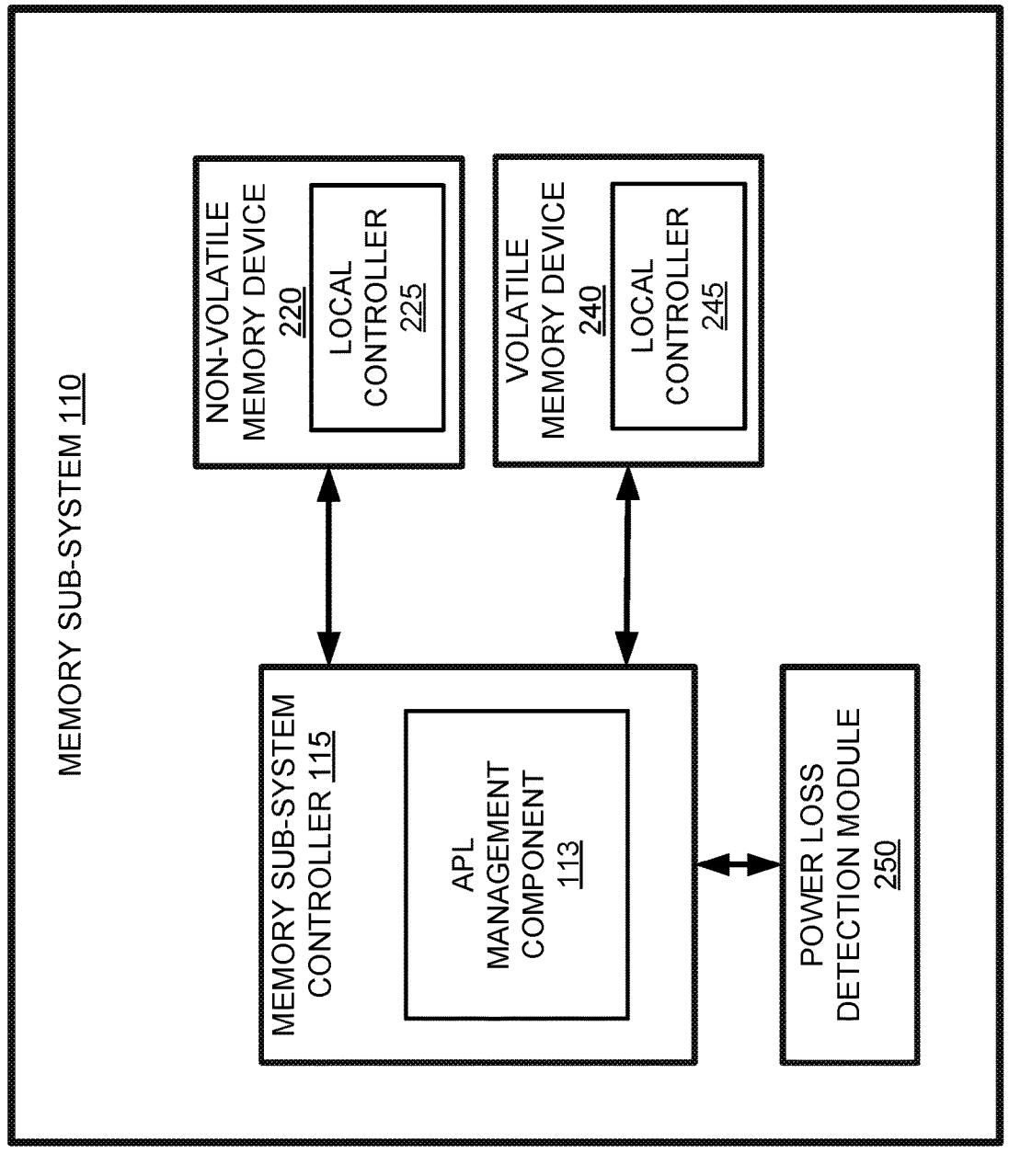
FIG. 2 is a block diagram of an example system for managing APL in accordance with some embodiments of the present disclosure.

A more detailed depiction of an embodiment of the present disclosure that is shown in FIG. 2 includes an example memory sub-system 110 and can be understood with continued reference to FIG. 1. As shown in FIG. 2, the memory sub-system 110 can include the memory sub-system controller 115 that includes the APL management component 113, a non-volatile memory device 220, and a volatile memory device 240. The memory sub-system controller 115 can also include a power loss detection module 250, which also can be a component of the APL management component 113 or be a discrete component of computing system 100 that is communicatively coupled to other components of the memory sub-system 110 or to the host system 120.

The power loss detection module 250 can include a device or circuitry configured to monitor a power state metric (e.g., a parameter of a power supply) and detect an event associated with the power state metric (e.g., a parameter of a power supply) satisfies a threshold criterion. The power state metric may be one or more parameters associated with power supplied, including voltage, current, etc. In some embodiments, the power loss detection module 250 can monitor the values of voltages passing through it and other components of the memory sub-system 110. In some embodiments, the power loss detection module 250 can detect increases and decreases in voltages and generate signals that indicate voltage values or indicate that the voltage or a change in the voltage satisfies a threshold criterion. For example, the power loss detection module 250 can detect a drop in voltage below a predetermined threshold that is indicative of a power loss event and generate a signal to be transmitted to other components of memory sub-system 110. The power loss detection module 250 can send an indication of potential power loss (e.g., a potential power loss signal) that indicates a power loss event is occurring or is imminent to host system (e.g., host system 120), controllers (e.g., controllers 115, 135), memory devices 220, 240 and their constituent components. In some embodiments, the power loss detection module 250 can be a voltage drop detector (VDET) in a form of hardware so that the potential power loss event can be rapidly detected.

The APL management component 113 can detect an imminent power loss, modify the execution of commands and the transfer of data in the memory sub system 110, and store designated data (including system data and metadata) in a fast manner in a non-volatile memory device to ensure the integrity of the data saved in the memory sub-system 110 and prevent the loss of critical system data and metadata. By altering priority of operations and changing programming speed in the memory sub-system 110, the APL management component 113 can prioritize designated data to be saved before a complete loss of power occurs.

The APL management component 113 can determine an occurrence of a potential power loss event by determining whether a power state metric associated with the volatile memory device 240 (e.g., a value of a parameter of a power supply measured at a component that is connected with the volatile memory device) satisfies a threshold criterion. For example, the APL management component 113 may receive the power state metric associated with the volatile memory device 240 from the power loss detection module 250 and compare the power state metric to a threshold criterion in order to determine whether a potential power loss event occurs. In another example, the APL management component 113 may use the signals (e.g., an indication of a potential power loss) received from the power loss detection module 250 to make the determination whether a potential power loss event occurs. In some embodiments, the APL management component 113 can determine whether a voltage or a change in voltage at an interface or an input/output pin of the volatile memory device 240 satisfies a threshold criterion (e.g., falling below or rising above a predetermined value). For example, the APL management component 113 can determine whether the voltage at a power supply pin of a PCIe interface used by the volatile memory device 240 is less than a specific value or is a significantly low fraction of the average operating voltage of a component of computing device 100. In another example, the APL management component 113 can determine whether the voltage at an input/out pin of the volatile memory device 240 is less than a specific value or is a significantly low fraction of the average operating voltage of a component of computing device 100. In some embodiments, it can detect a rapid change in the voltages (e.g., at the interface or the input/output pin) over a short period of time.

In response to determining that a power state metric satisfies the threshold criterion, the APL management component 113 can stop the performance of operations associated with the volatile memory device 240, including the transmission of data between the volatile memory device 240 and other components of the computing system 100.

The APL management component 113 can stop performance of operations, including transmission of data between components of the memory sub-system (e.g., all data from/to the volatile memory of the memory sub-system). The operations can include writing, reading, erasing operations, etc. The APL management component 113 can stop the transmission of data by disabling the communication channels between components that are identified by the settings of the memory sub-system controller. For example, the APL management component 113 can stop data traffic between the memory sub-system controller 115 and the local controller 225.

Similarly, the APL management component 113 can stop the data traffic between the memory sub-system controller 115 and the host system 120 if the data is transmitted between the host system 120 and the local controller 225 via the memory sub-system controller 115. Additionally, the APL management component 113 can stop the data traffic within the volatile memory device 240. Each of these options can be selected based on a predetermined setting for APL handling of the memory sub-system controller 115.

In some embodiments, the APL management component 113 may mark, as uncompleted or invalid, the pending operations and the operations currently being performed but unfinished. In some embodiments, the APL management component 113 may clear the queue which holds the pending operations. In some implementations, making the operations and/or clearing the queue can company with collecting and/or transmitting the related information. For example, the information related to marking and/or clearing can include data about the status of operations and the status of the data sets that were transmitted or pending in the queue (e.g., data indicating completion/execution of a command or indicating transmission of information to the memory device). The information regarding marking and/or clearing may be collected as designated data, which can be transmitted, and stored, as described later, to a non-volatile memory device.

In some embodiments, the APL management component 113 can send a command (e.g., stop-execution instruction) to the volatile memory device 240 to trigger a stop in the performance of operations and the transmission of data (referred to as "stop command"). In some embodiments, the stop command can be synchronized with the clock of one of the components of memory sub-system 110, of memory sub-system controller 115, or of the computing system 100. The local controller 245 of the volatile memory device 240, upon receiving the stop command, can stop the pending read/write operations that have not yet been completed by respectively writing data to and reading data from the volatile memory device 240 (e.g., particular areas on the volatile memory device 240) and/or stopping the flow of data traffic (i.e., the transmission of commands) between components of the computing system 100 or memory sub-system 110 based on a setting of the memory sub-system 110 or based on a received signal. For example, the local controller 245 can stop the transmission of data and commands being sent to the APL management component 113. The local controller 245 can also stop the transmission of data and commands to a component configured to manage the execution of operations according to a sequencing or concurrency scheme performed on the volatile memory device 240.

The APL management component 113 can switch from a program mode being used for programming at the time of detecting an imminent power loss (also referred to as "current program mode") in the memory sub-system 110 to a fast program mode. For example, the APL management component 113 may switch from the current program mode to the fast program mode responsive to determining that a power state metric satisfies the threshold criterion or responsive to stopping the operation performance and data transmissions.

Switching from the current program mode to the fast program mode may involve changing a voltage parameter applied during a program operation, decreasing a time in which a voltage is applied in a program pulse phase of the program operation, increasing a magnitude of a voltage applied in a program pulse phase of the program operation, removing or skipping a program verify phase of a program operation, and/or a combination thereof. Other methods that would decrease the program time would also be applicable to the present disclosure.

Figure 3A:
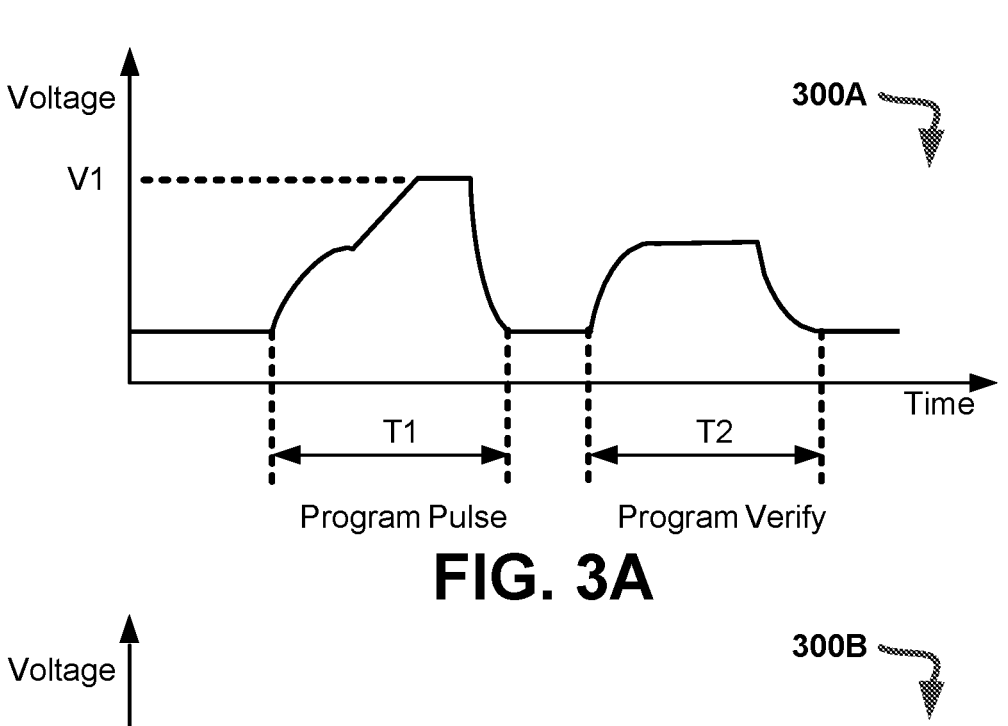
FIGS. 3A-3C are example signals for changing program modes in accordance with some embodiments of the present disclosure.
Figure 3B:
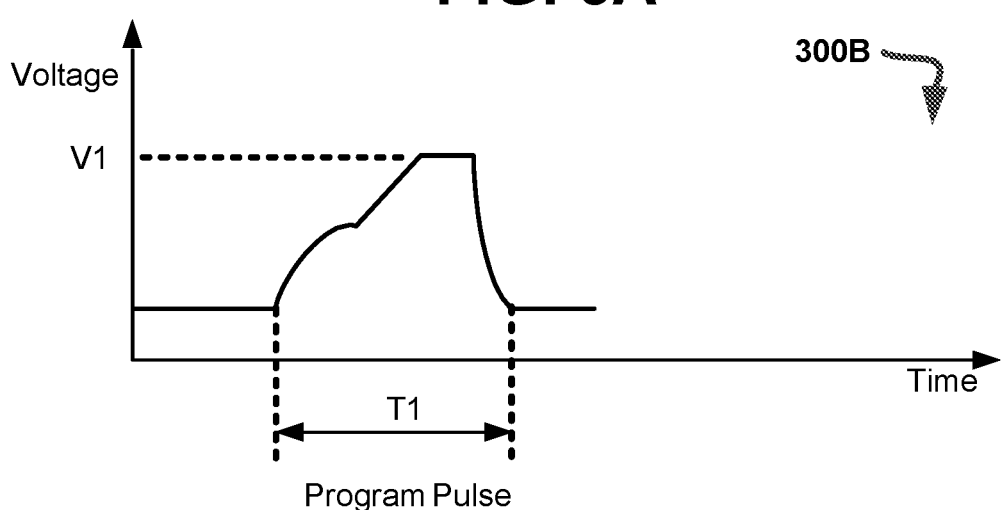
Figure 3C:
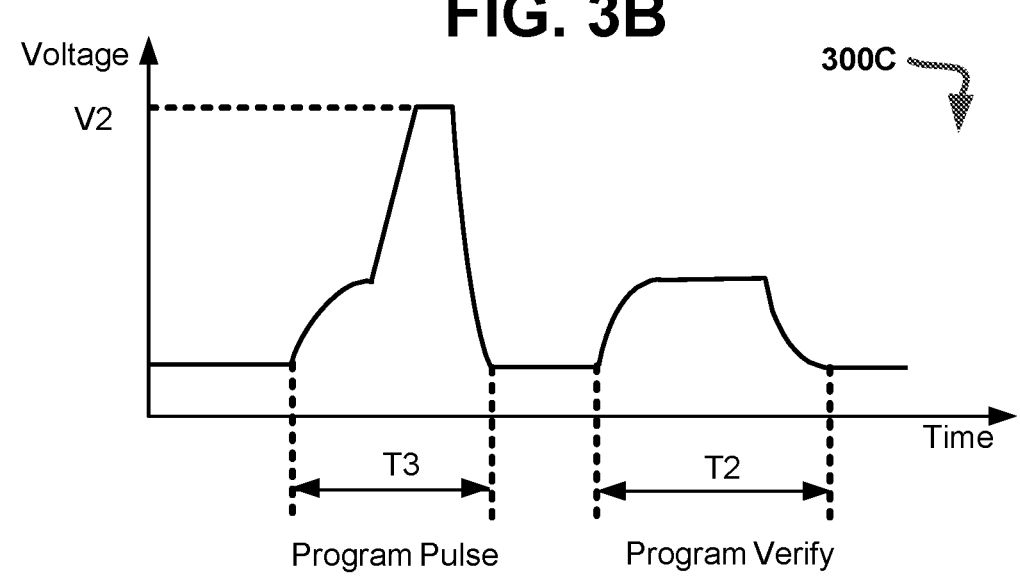

Using the example as shown in FIGS. 3A-3C, FIG. 3A illustrates a current program mode, while FIGS. 3B-3C each illustrates a fast program mode compared to the current program mode in FIG. 3A. As shown in FIG. 3A, the current program mode may be one-pulse, one-verify (1P1V) program voltage pattern applied during a program operation. In general, a program operation can include a program phase where a program pulse is applied and a program verify phase where a verify voltage is applied. As shown, the example 1P1V program voltage pattern 300A includes a program pulse that is followed by a program verify operation. The program pulse is associated with a program voltage V1. As shown in FIG. 3A, when a memory device performs a 1P1V program operation, the memory device 220 applies the voltage on a selected access line during a first time period T1 that corresponds to the program pulse phase and during a second time period T2 that corresponds to the program verify phase.

The program verify phase allows the memory device 220 to perform a sensing operation (e.g., a read operation) to detect whether the verify voltage applied to a memory cell causes that memory cell to conduct (e.g., whether current flows through the memory cell when the verify voltage is applied). Based on a desired state of the memory cell and based on whether the memory cell conducts when the verify voltage is applied, the memory device 220 may identify the memory cell as a passed memory cell that stores the desired state or a failed memory cell that does not store the desired state. For example, in a single-level memory cell that stores one of two data states, the memory device 120 may apply a verify voltage that is between a first threshold voltage corresponding to a first data state (e.g., 1) and a second threshold voltage corresponding to a second data state (e.g., 0). In this example, the memory cell stores the first data state (e.g., 1) if current is detected, and the memory cell stores the second data state (e.g., 0) if current is not detected. After applying the verify voltage, the memory device 220 may reduce the voltage on the selected access line to the baseline voltage.

As shown in FIG. 3B, the fast program mode may involve performing one-pulse, zero-verify (1P0V) (i.e., a single programming pulse with no subsequent verification) program operations. As shown, the example 1P0V program voltage pattern 300B includes a first program pulse associated with a program voltage V1. When a memory device performs a 1P0V program operation, the memory device 220 applies the voltage on a selected access line during a first time period T1 that corresponds to the program pulse phase. As such, the total time used in the program operation by using the program voltage pattern 300B is shorter than the total time used in the program operation by using the program voltage pattern 300A.

As shown in FIG. 3C, the fast program mode may be one-pulse, zero-verify (1P1V) program voltage applied during a program operation. Compared to FIG. 3A, a fast program operation can include a program phase where a program pulse is applied and a program verify phase where a verify voltage is applied, but the time used in the program phase is shorter. As shown, the example 1P1V program voltage pattern 300C includes a program pulse associated with a program voltage V2. When a memory device performs such 1P1V program operation, the memory device 220 applies the voltage on a selected access line during a third time period T3 that corresponds to the program pulse phase and during a second time period T2 that corresponds to the program verify phase. The third time period T3 is shorter than the first time period T1, and in such cases, the program voltage V2 can be larger than the program voltage V1. That is, the program voltage ramps up faster. As such, the total time used in the program operation by using the program voltage pattern 300C is shorter that the total time used in the program operation by using the program voltage pattern 300A.

Although the examples shown with FIGS. 3A-3C change from a slow program mode to a fast program mode by removing the program verify phase or ramping up the program voltage during the program pulse phase, a combination of removing the program verify phase and ramping up the program voltage during the program pulse phase can be applied. Additionally, or alternatively, other changes to parameters applied during the program operation can be also applicable.

After changing to a fast program mode, the APL management component 113 can execute the program (i.e., write) operations of designated data using the fast program mode. Designated data may include data regarding the current open blocks, the last wordline or sub-block used, the current location of a media scan, the current time and date data, the read disturb data (e.g., read disturb counters), or other error-related data. The current open block data may include the identification (e.g., physical address or logical address) of a block being open. The last wordline or sub-block used data may include the identification (e.g., physical address or logical address) of the wordline or sub-block that was last used. The current location of a media scan data may include the identification of a location in a media last scanned. The current time and date data may include the time and date information when data being collected. The read disturb data refers to data of error (e.g., count) where a read to one wordline impacts the threshold voltages of unread cells in different wordlines of the same block.

The designated data may reflect data that has been retrieved most recently, and the system can add a timestamp to the designated data. For example, the data can be retrieved at the time of detecting a potential power loss event or at the time of stopping the operation performance or data transmission. In another example, the data can be retrieved at a time prior to the detection or stopping action, such as the last time the data retrieved. In some examples, the processing device retrieves the designated data at a predetermined frequency and stores the designated data in a volatile memory device, and in this case, it can prevent any delay caused by gathering designated data.

In other embodiments, the APL management component 113 can perform APL management functions similar to those described above upon a trigger signal. For example, the trigger signal may indicate that the designated data is available to be stored in the non-volatile memory device. As such, the system can use the traditional power management methods instead of the present disclosure when there is no designated data available for saving. The APL management component 113 can register an APL management instruction and initiate the APL management scheme based on a predetermined setting of the memory sub-system 110 or the memory sub-system controller 115.

FIG. 4 is a flow diagram of an example method 400 for managing APL, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the APL management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic can determine whether a parameter of a power supply of a volatile memory device satisfies a threshold criterion. In some implementations, the processing logic can determine whether the parameter of the power supply satisfies a threshold criterion by monitoring the voltage at a power supply terminal in the volatile memory device or an interface of the volatile memory device, and when the change of the voltage exceeds a certain threshold value or the value of the voltage is below a certain threshold value, the processing logic determines that the parameter of the power supply satisfies the threshold criterion.

At operation 420, responsive to determining that the parameter of the power supply satisfies the threshold criterion, the processing logic can stop performance of operations in the volatile memory device. In some implementations, stopping the performance of operations can involve stopping execution operations and/or stopping data transmission. In some implementations, stopping the performance of operations can involve marking the pending or unfinished operations as incomplete or invalid, for example, by an indicator (e.g., a flag bit) and save it as the designated data. In some implementations, stopping the performance of operations can involve clearing a queue of pending operations.

At operation 430, the processing logic can change a voltage parameter applied during a program operation in order to switch a program mode being used for programming in the memory device to a fast program mode. In some implementations, changing a voltage parameter may involve decreasing a total time for applying a voltage in the program operation, which may include increasing a voltage applied in the program operation, and/or skipping a program verify phase in the program operation.

At operation 440, the processing logic can program, using the changed voltage parameter, designated data associated with the volatile memory device to a designated location on a non-volatile memory device. In some implementations, the designated data comprises at least one of: current open block data, last-used wordline data, last-used sub-block data, current location data of a media scan, current time data, or read disturb data. In some implementations, the designated location comprises a single level cell (SLC) block. In some implementations, the designated location may be predetermined and stored as metadata that the processing logic can access. In some implementations, the processing logic decides a location as the designated location based on the memory locations that are accessible to it.

Figure 5:
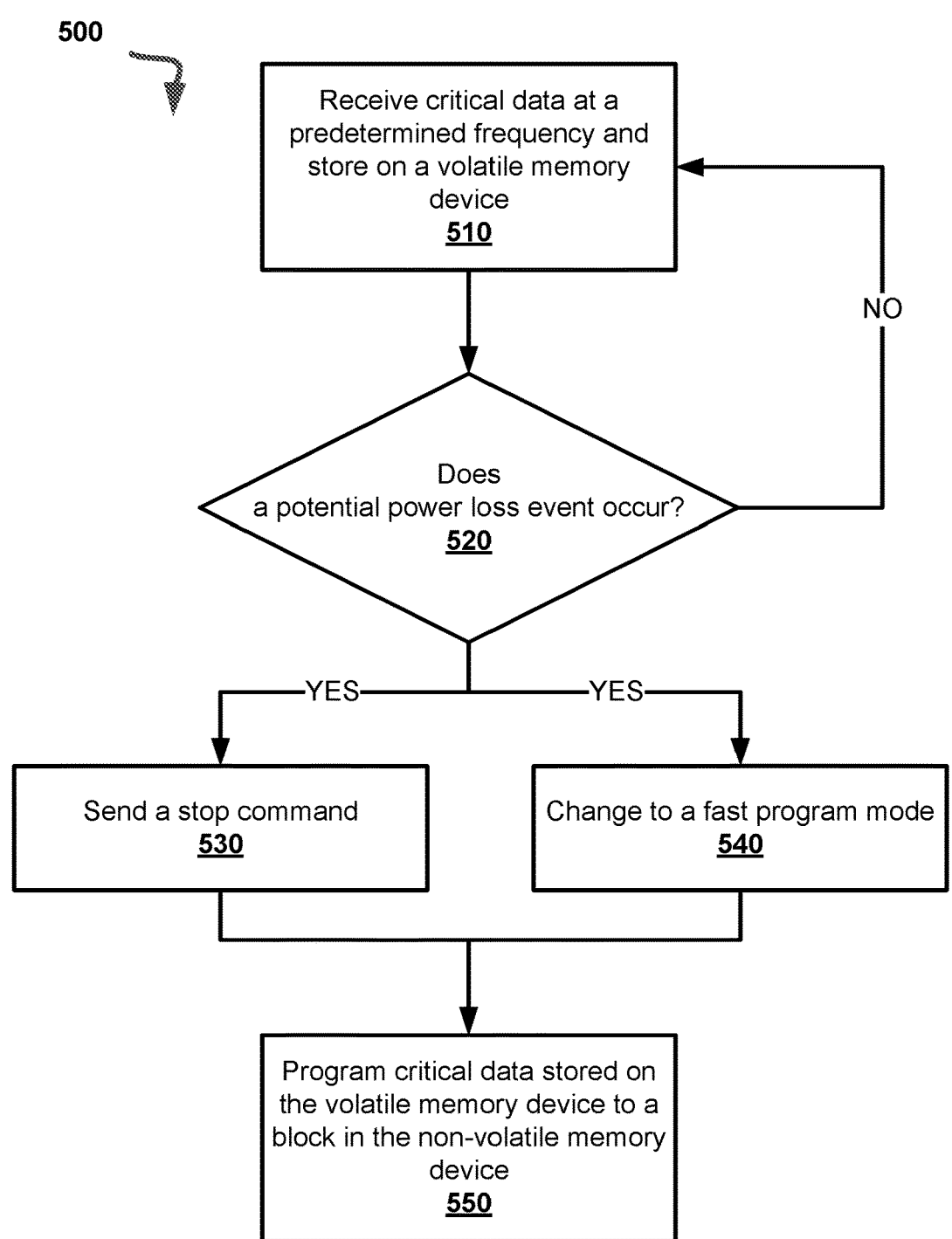

FIG. 5 is a flow diagram of an example method 500 for managing APL, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the APL management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic can receive designated data at a predetermined frequency and store the designated data on a volatile memory device. In one example, the processing logic can save the designated data in a data structure and save a snapshot of the data structure. Saving the snapshot of the data structure can include taking the current data structure located in a volatile memory device and saving an identical copy of it in a dedicated area of the volatile memory device. The dedicated area of the non-volatile memory device can span over one or more management units (MUs), which can be physical or logical blocks of a predetermined size. The processing logic can save the snapshot at regular intervals of time that can be predetermined and set prior to the operation. Accordingly, saving of a snapshot of the data structure can be performed with a predetermined frequency. In some embodiments, due to potential degradation of the medium performance caused by read and write cycles, the frequency between sequential saves of the snapshots may be adjusted or changed for the purpose of APL management.

At operation 520, the processing logic can determine whether a potential power loss event occurs. A potential loss of power can be detected by measuring a voltage drop satisfying a threshold criterion across elements of the memory sub-system 110. In some implementations, operation 520 can be the same as or similar to operation 410. Responsive to determining that the potential power loss event has not occurred, the processing logic can process back to operation 510.

Responsive to determining that the potential power loss event occurs, the processing logic can simultaneously, at operation 530, send a stop command to elements of the memory sub-system 110 and, at operation 540, change a program mode to a fast program mode. Responsive to sending a stop command, the processing logic can stop the operation performance and data transmission. In some implementations, responsive to sending a stop command, the processing logic can mark the pending or unfinished operations as incomplete or invalid, for example, by an indicator (e.g., a flag bit) and save it as the designated data. In some implementations, responsive to sending a stop command, the processing logic can clear a queue of pending operations. Changing to a fast program mode at operation 540 can be same as or similar to operation 430.

At operation 540, the processing logic can program designated data stored on the volatile memory device to a block in the non-volatile memory device, which can same as or similar to operation 440.

Figure 6:
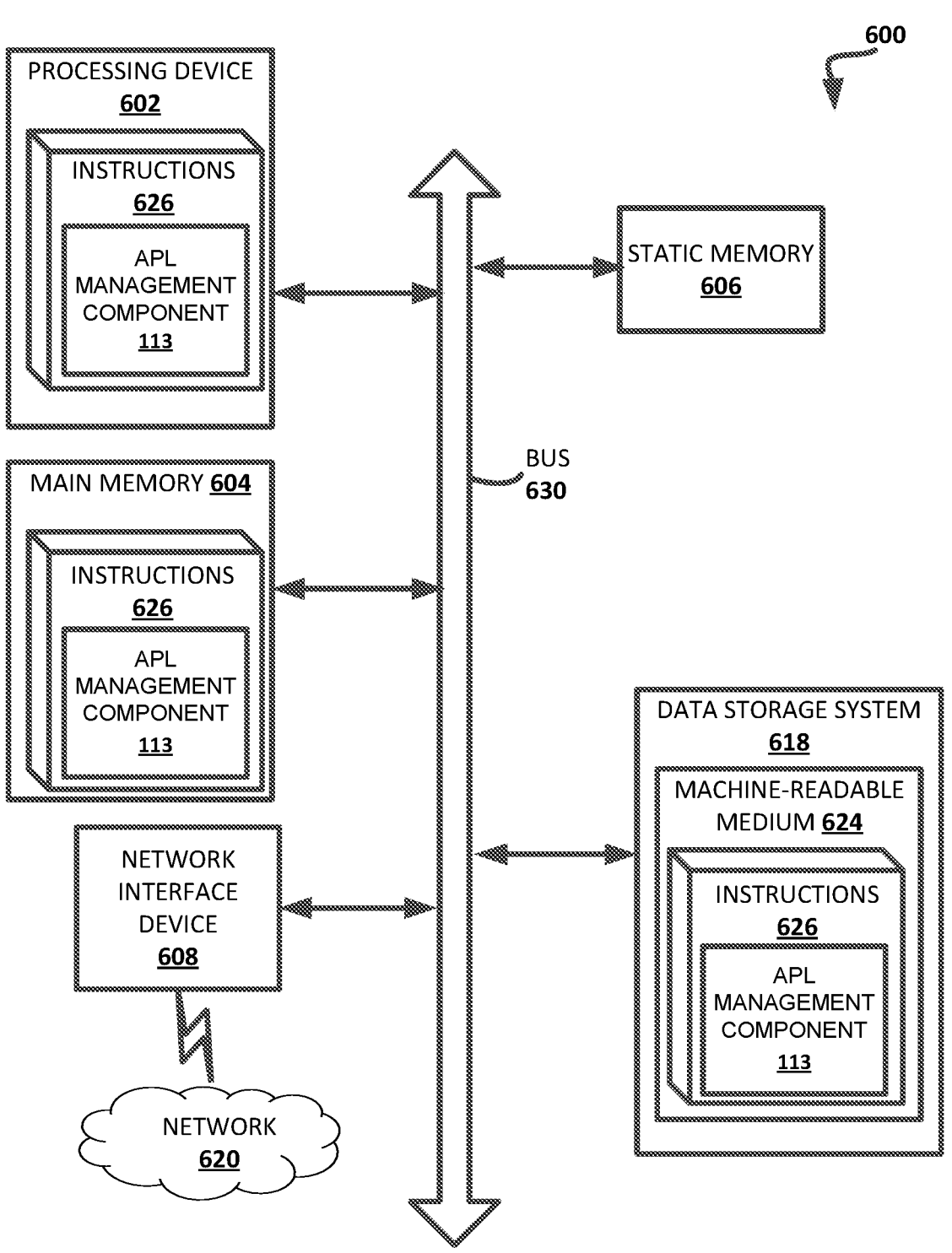
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the APL management component of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an APL management component (e.g., the APL management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a plurality of memory devices comprising a volatile memory device and a non-volatile memory device; and
a processing device, operatively coupled with the plurality of memory devices, to perform operations comprising:
responsive to detecting a potential power loss event, sending stop-execution instruction to the volatile memory device;
changing to a fast program mode by adjusting a parameter of a program operation; and
programming, using the fast program mode, designated data associated with the volatile memory device to a block on the non-volatile memory device.

2. The system of claim 1, wherein the processing device is to perform operations further comprising:
responsive to detecting the potential power loss event, stopping performance of operations in the volatile memory device.

3. The system of claim 1, wherein the processing device is to perform operations further comprising:
receiving the designated data at a predetermined frequency; and
storing the designated data in the volatile memory device.

4. The system of claim 1, wherein the processing device is to perform operations further comprising:
responsive to detecting the potential power loss event, retrieving the designated data.

5. The system of claim 1, wherein the designated data comprises at least one of: open block data, last-used word-line data, last-used sub-block data, location data of a media scan, time data, or read disturb data.

6. The system of claim 1, wherein detecting the potential power loss event further comprises determining whether a parameter of a power supply of the volatile memory device satisfies a threshold criterion, and wherein the parameter of the program operation specifies a total time for applying a voltage pulse in the program operation.

7. The system of claim 1, wherein detecting the potential power loss event further comprises determining whether a parameter of a power supply of the volatile memory device satisfies a threshold criterion, and wherein the parameter of the program operation specifies a voltage applied in the program operation.

8. The system of claim 1, wherein detecting the potential power loss event further comprises determining whether a parameter of a power supply of the volatile memory device satisfies a threshold criterion, and wherein the parameter of the program operation specifies a duration of a program verify phase in the program operation.

9. The system of claim 1, wherein the block is a single level cell (SLC) block.

10. A method comprising:
responsive to determining that a potential power loss event occurs, sending, by a processing device, stop-execution instruction to a volatile memory device;
changing to a fast program mode by adjusting a parameter of a program operation; and
programming, using the fast program mode, designated data associated with the volatile memory device to a block on a non-volatile memory device.

11. The method of claim 10, further comprising:
receiving the designated data at a predetermined frequency; and
storing the designated data in the volatile memory device.

12. The method of claim 10, further comprising:
responsive to determining that the potential power loss event occurs, retrieving the designated data.

13. The method of claim 10, wherein the designated data comprises at least one of: open block data, last-used word-line data, last-used sub-block data, location data of a media scan, time data, or read disturb data.

14. The method of claim 10, further comprising:
responsive to sending the stop-execution instruction, marking stopped operations.

15. The method of claim 10, further comprising:
responsive to sending the stop-execution instruction, clearing a queue of pending operations.

16. The method of claim 10, wherein the stop-execution instruction comprises an instruction to stop transmission of data.

17. A non-transitory computer-readable storage medium comprising instructions that, when executed by a processing device, cause the processing device to perform operations comprising:
responsive to detecting a potential power loss event, sending stop-execution instruction to a volatile memory devices;
changing to a fast program mode by adjusting a parameter of a program operation; and
programming, using the fast program mode, designated data associated with a volatile memory device to a block on a non-volatile memory device.

18. The non-transitory computer-readable storage medium of claim 17, wherein the processing device is to perform operations further comprising:
receiving the designated data at a predetermined frequency; and
storing the designated data in the volatile memory device.

19. The non-transitory computer-readable storage medium of claim 17, wherein the processing device is to perform operations further comprising:
responsive to detecting the potential power loss event, retrieving the designated data.

20. The non-transitory computer-readable storage medium of claim 17, wherein the designated data comprises at least one of: open block data, last-used wordline data, last-used sub-block data, location data of a media scan, time data, or read disturb data.

* * * * *